US010026841B2

(12) United States Patent
Zhou (10) Patent No.: US 10,026,841 B2
(45) Date of Patent: Jul. 17, 2018

(54) SEMICONDUCTOR DEVICE AND MANUFACTURING METHOD THEREFOR

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/603,768

(22) Filed: May 24, 2017

(65) Prior Publication Data
US 2017/0352758 A1 Dec. 7, 2017

(30) Foreign Application Priority Data
Jun. 1, 2016 (CN) .......................... 2016 1 0379186

(51) Int. Cl.
*H01L 21/8234* (2006.01)
*H01L 29/78* (2006.01)
(Continued)

(52) U.S. Cl.
CPC .... *H01L 29/7848* (2013.01); *H01L 21/02164* (2013.01); *H01L 21/02238* (2013.01); *H01L 21/2253* (2013.01); *H01L 21/26513* (2013.01); *H01L 21/26586* (2013.01); *H01L 21/28167* (2013.01); *H01L 21/3081* (2013.01);
(Continued)

(58) Field of Classification Search
CPC .......... H01L 29/7848; H01L 29/66795; H01L 29/7833; H01L 29/7851; H01L 21/28167; H01L 21/02164; H01L 21/02238; H01L 21/31051; H01L 21/3081; H01L 29/0649;
(Continued)

(56) References Cited

U.S. PATENT DOCUMENTS 6,872,640 B1 * 3/2005 Mouli ................. H01L 27/1203
257/347
6,967,143 B2 * 11/2005 Mathew ............ H01L 21/26586
257/E21.345

(Continued)

*Primary Examiner* — Jarrett Stark
(74) *Attorney, Agent, or Firm* — Brinks Gilson & Lione (57) ABSTRACT

The present disclosure relates to the technical field of semiconductors and discloses a semiconductor device and a manufacturing method therefor. Forms of the method may include: providing a substrate structure, where the substrate structure includes: a semiconductor substrate, a semiconductor fin on the semiconductor substrate, isolation regions at two sides of the semiconductor fin, a gate dielectric layer on a surface of the semiconductor fin above the isolation regions, and a gate on a part of the gate dielectric layer; and performing threshold voltage adjustment ion implantation on a part of the semiconductor fin that is not covered by the gate, so as to enable implanted impurities to diffuse into a part of the semiconductor fin that is covered by the gate. Forms of the present disclosure can reduce loss of impurities implanted by the threshold voltage adjustment ion implantation.

17 Claims, 7 Drawing Sheets

(51) Int. Cl.
*H01L 21/02* (2006.01)
*H01L 21/225* (2006.01)
*H01L 21/265* (2006.01)
*H01L 21/28* (2006.01)
*H01L 21/306* (2006.01)
*H01L 21/308* (2006.01)
*H01L 21/3105* (2006.01)
*H01L 21/762* (2006.01)
*H01L 29/06* (2006.01)
*H01L 29/08* (2006.01)
*H01L 29/167* (2006.01)
*H01L 29/66* (2006.01)

(52) U.S. Cl.
CPC .. *H01L 21/30604* (2013.01); *H01L 21/31051* (2013.01); *H01L 21/76224* (2013.01); *H01L 29/0649* (2013.01); *H01L 29/0847* (2013.01); *H01L 29/167* (2013.01); *H01L 29/66575* (2013.01); *H01L 29/66636* (2013.01); *H01L 29/66795* (2013.01); *H01L 29/66803* (2013.01); *H01L 29/7833* (2013.01); *H01L 29/7851* (2013.01); *H01L 21/823431* (2013.01)

(58) Field of Classification Search
CPC ........... H01L 29/66636; H01L 29/0847; H01L 21/30604; H01L 29/66575; H01L 29/167
See application file for complete search history.

(56) References Cited

U.S. PATENT DOCUMENTS

| | | | | |
|---|---|---|---|---|
| 7,351,627 B2* | 4/2008 | Jin | ...................... | H01L 21/2652 257/E21.337 |
| 8,237,228 B2* | 8/2012 | Or-Bach | ............... | G03F 9/7076 257/369 |
| 9,520,467 B1* | 12/2016 | Chu | ...................... | H01L 27/088 |
| 2005/0148114 A1* | 7/2005 | Rhodes | ............. | H01L 27/14609 438/120 |
| 2006/0094194 A1* | 5/2006 | Chen | ................. | H01L 21/26506 438/301 |
| 2006/0255375 A1* | 11/2006 | Dokumaci | ........ | H01L 21/26586 257/270 |
| 2007/0148836 A1* | 6/2007 | Cheng | ............ | H01L 21/823418 438/157 |
| 2008/0048262 A1* | 2/2008 | Lee | ................... | H01L 29/41791 257/347 |
| 2010/0096680 A1* | 4/2010 | Mouli | .................... | B82Y 10/00 257/296 |
| 2010/0230757 A1* | 9/2010 | Chen | ................. | H01L 21/76232 257/368 |
| 2011/0097889 A1* | 4/2011 | Yuan | ................. | H01L 21/76224 438/595 |
| 2012/0126296 A1* | 5/2012 | Huang | ................. | H01L 29/66628 257/288 |
| 2013/0009251 A1* | 1/2013 | Jain | ................. | H01L 21/823807 257/369 |
| 2013/0069164 A1* | 3/2013 | Marino | ........... | H01L 21/823431 257/369 |
| 2013/0193498 A1* | 8/2013 | Horch | ................. | G06F 17/5072 257/296 |
| 2013/0270628 A1* | 10/2013 | Huang | ................ | H01L 29/0847 257/329 |
| 2014/0252412 A1* | 9/2014 | Tsai | .................. | H01L 21/02521 257/192 |
| 2014/0273380 A1* | 9/2014 | Liu | .................... | H01L 29/66795 438/283 |
| 2017/0033106 A1* | 2/2017 | Walke | ............. | H01L 21/823807 |
| 2017/0040449 A1* | 2/2017 | Asenov | ............ | H01L 29/41775 |
| 2017/0250279 A1* | 8/2017 | Wei | ..................... | H01L 29/7848 |

* cited by examiner

FIG. 11

SEMICONDUCTOR DEVICE AND MANUFACTURING METHOD THEREFOR

CROSS-REFERENCE TO RELATED APPLICATION

This application is based on and claims priority to Chinese patent Application CN201610379186.5, filed Jun. 1, 2016, the entire content of which is incorporated herein by reference.

BACKGROUND

Technical Field

The present disclosure relates to the technical field of semiconductors, and in particular, to a semiconductor device and a manufacturing method therefor.

Related Art

With reduction in key dimensions of a Metal Oxide Semiconductor Field Effect Transistor (MOSFET), a Short Channel Effect (SCE) becomes a crucial issue. A Fin Field Effect Transistor (FinFET) device has a good gate-control capability, and can effectively inhibit the short channel effect. Therefore, a FinFET device is generally adopted in design of a small-sized semiconductor device.

However, for a FinFET device, threshold voltage (VT) adjustment ion implantation is a challenge. In existing solutions, threshold voltage adjustment ion implantation is performed for a fin after the fin is formed, and an oxidation process is performed after the threshold voltage adjustment ion implantation, so as to form an oxide layer on a surface of the fin. It is found by the inventor of the present disclosure that the existing solutions may cause loss of impurities implanted by the threshold voltage adjustment ion implantation, so that the threshold voltage cannot be adjusted to an expected threshold voltage.

SUMMARY

An objective of forms of the present disclosure lies in putting forward a novel manufacturing method for a semiconductor device, capable of reducing loss of impurities implanted by the threshold voltage adjustment ion implantation.

Forms of the present disclosure provide a manufacturing method for a semiconductor device, including: providing a substrate structure, where the substrate structure includes: a semiconductor substrate, a semiconductor fin on the semiconductor substrate, isolation regions at two sides of the semiconductor fin, a gate dielectric layer on a surface of the semiconductor fin above the isolation regions, and a gate on a part of the gate dielectric layer; and performing threshold voltage adjustment ion implantation on a part of the semiconductor fin that is not covered by the gate, so as to enable implanted impurities to diffuse into a part of the semiconductor fin that is covered by the gate.

In some forms, an included angle between an ion implantation direction of the threshold voltage adjustment ion implantation and a normal of an upper surface of the semiconductor fin ranges from 10° to 20°.

In some forms, the ion implantation direction of the threshold voltage adjustment ion implantation is substantially parallel to a plane that is perpendicular to a side surface of the semiconductor fin.

In some forms, implantation conditions of the threshold voltage adjustment ion implantation include that: the implanted ions are boron ions, the implanted energy ranges from 0.5 Kev to 5 Kev, and the implanted dose ranges from $1\times10^{13}/cm^2$ to $1\times10^{14}/cm^2$.

In some forms, implantation conditions of the threshold voltage adjustment ion implantation include that: the implanted ions are arsenic ions, the implanted energy ranges from 1 Kev to 10 Kev, and the implanted dose ranges from $5\times10^{12}/cm^2$ to $5\times10^{13}/cm^2$.

In some forms, the method further includes: forming a sidewall spacer on a side surface of the gate.

In some forms, the method further includes: performing light doped drain (LDD) ion implantation on the part of the semiconductor fin that is not covered by the gate by using the sidewall spacer as a mask.

In some forms, the implanted dose of the threshold voltage adjustment ion implantation is less than the implanted dose of the LDD ion implantation.

In some forms, the implanted dose of the LDD ion implantation ranges from $5\times10^{14}/cm^2$ to $1\times10^{15}/cm^2$.

In some forms, the method further includes: etching the part of the semiconductor fin that is not covered by the gate so as to form a recess; and epitaxially growing a semiconductor material in the formed recess so as to form a source region and a drain region.

In some forms, a hard mask is provided on the gate; and the method further includes: after the source region and the drain region are formed, removing the hard mask from the gate.

In some forms, the material of the semiconductor includes: SiGe, SiC, or Si.

In some forms, the step of providing a substrate structure includes: providing a semiconductor substrate; forming a semiconductor fin on the semiconductor substrate; forming isolation regions on the semiconductor substrate at two sides of the semiconductor fin; forming a gate dielectric layer on a surface of the semiconductor fin above the isolation regions; and forming a gate on a part of the gate dielectric layer.

In some forms, the step of forming a semiconductor fin on the semiconductor substrate includes: forming a patterned hard mask on the semiconductor substrate; etching the semiconductor substrate by using the patterned hard mask as a mask, so as to form a semiconductor substrate and a semiconductor fin on the semiconductor substrate; and the method further includes: after the isolation regions are formed on the semiconductor substrate at two sides of the semiconductor fin, removing the hard mask from the semiconductor fin.

In some forms, the forming isolation regions on the semiconductor substrate at two sides of the semiconductor fin includes: depositing an isolating material so as to fill spaces at two sides of the semiconductor fin and to cover the semiconductor fin; planarizing the isolating material; and removing a part of the remaining isolating material, to expose a part of the semiconductor fin, so as to form the isolation regions.

In some forms, the method further includes: before depositing an isolating material, forming a liner layer on surfaces of the semiconductor substrate and the semiconductor fin; and during removal of a part of the remaining isolating material, also removing the liner layer at two sides of the part of the remaining isolating material, so as expose a part of the semiconductor fin.

In some forms, the material of the semiconductor fin is silicon; and the forming a gate dielectric layer on a surface of the semiconductor fin above the isolation regions includes: oxidizing a surface of the semiconductor fin above the isolation regions, to form a silicon oxide as the gate dielectric layer.

Another form of the present disclosure provides a semiconductor device, including: a semiconductor substrate; a semiconductor fin on the semiconductor substrate; isolation regions at two sides of the semiconductor fin; a gate dielectric layer on a surface of the semiconductor fin above the isolation regions; a gate on a part of the gate dielectric layer; a first impurities region, located in a part of the semiconductor fin that is not covered by the gate; and a second impurities region, located in a part of the semiconductor fin that is covered by the gate, where the first impurities region is formed through threshold voltage adjustment ion implantation on the part of the semiconductor fin that is not covered by the gate after the gate is formed, and the second impurities region is formed after the impurities implanted by the threshold voltage adjustment ion implantation diffuse into the part of the semiconductor fin that is covered by the gate.

In some forms, the gate dielectric layer includes impurities implanted by the threshold voltage adjustment ion implantation.

In some forms, the device further includes: a source region and a drain region located in the part of the semiconductor fin that is not covered by the gate.

The other features, aspects and advantages of the present disclosure become clear by describing the exemplary forms of the present disclosure in detail with reference to the accompanying drawings below.

BRIEF DESCRIPTION OF THE DRAWINGS

The accompanying drawings that constitute a part of the specification describe the exemplary forms of the present disclosure, and together with the specification, are used to interpret the principles of the present invention, where in the accompanying drawings.

DETAILED DESCRIPTION

The present disclosure is described in detail with reference to the accompanying drawings and various exemplary forms. It should be noted that: unless otherwise specified, the relative arrangements of the components and steps, numeral expressions, and values stated in these forms are not intended to limit the scope of the present disclosure.

In addition, it should be understood that the sizes of the respective components shown in the accompanying drawings are not drawn according to an actual proportion, so as to facilitate describing, for example, the thickness or width of some layers may be enlarged relative to other layer.

The description of at least one exemplary form below is illustrative only and should not be taken as any limitation to the present disclosure and application or use thereof in any sense.

The technology, methods, and devices that are known by a person of ordinary skill in the art are not discussed in detail, and in a proper situation, the technology, methods, and devices should be regarded as parts of the present specification.

It should be noted that: similar reference labels and letters in the following accompanying drawings indicate similar items. Therefore, once a certain item is defined in one accompanying drawing, the item needs not to be further discussed in the subsequent accompanying drawings.

The inventor of the present disclosure studied on the issue of loss of impurities implanted by threshold voltage ion implantation and found that: Impurities implanted by threshold voltage ion implantation are distributed in a fin at a position close to the surface. After the threshold voltage adjustment ion implantation, an oxidation process needs to be further performed so as to form, on the surface of the fin, an oxide layer as a gate dielectric layer. Because the solid solubility of the implanted impurities in the oxide layer is larger than that in the fin, the implanted impurities may easily diffuse into the formed oxide layer in the oxidation process, thereby causing a loss of impurities implanted by the threshold voltage ion implantation. On the basis of the above, the inventor provides the following technical solutions.

Figure 1:
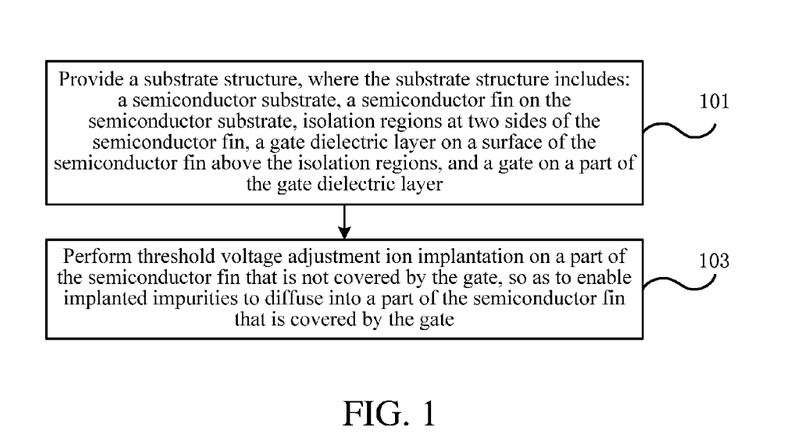
FIG. 1 is a flow chart of a manufacturing method for a semiconductor device according to a form of the present disclosure.

FIG. 1 is a flow chart of a manufacturing method for a semiconductor device. As shown in FIG. 1, the method includes the following steps:

First, in step 101, a substrate structure is provided.

Figure 2A:
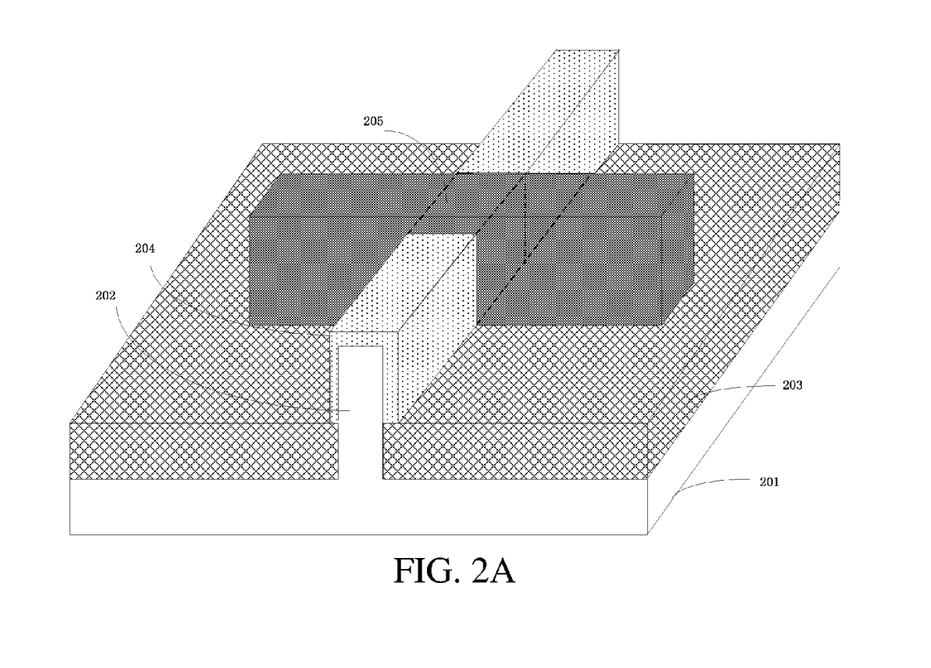
FIG. 2A is a three-dimensional schematic diagram of a substrate structure according to a form of the present disclosure.

FIG. 2A is a three-dimensional schematic diagram of a substrate structure. As shown in FIG. 2A, the substrate structure includes: a semiconductor substrate 201, a semiconductor fin 202 on the semiconductor substrate 201, isolation regions 203 at two sides of the semiconductor fin, a gate dielectric layer 204 on a surface of the semiconductor fin above the isolation regions 203, and a gate 205 on a part of the gate dielectric layer 204.

Figure 2B:
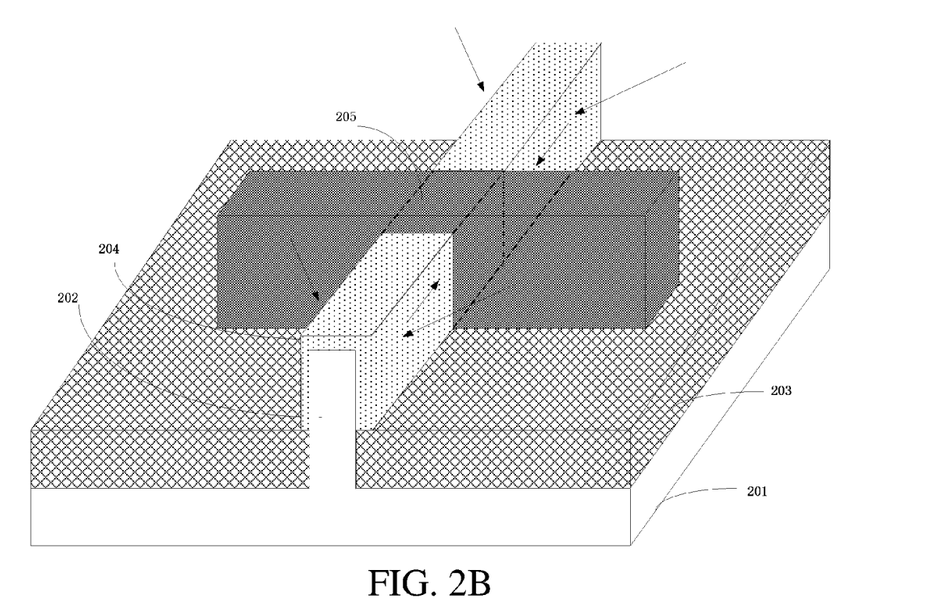
FIG. 2B is a three-dimensional schematic diagram of a threshold voltage adjustment ion implantation process according to a form of the present disclosure.

Then, in step 103, threshold voltage adjustment ion implantation is performed on a part of the semiconductor fin 202 that is not covered by the gate 205, so as to enable implanted impurities to diffuse into a part of the semiconductor fin 202 that is covered by the gate 205, as shown in FIG. 2B. After the threshold voltage adjustment ion implantation is performed, the implanted impurities may diffuse laterally, to enter the part of the semiconductor fin 202 that is covered by the gate 205, that is, a channel region, so as to make it convenient to adjust a threshold voltage of the device.

In this form, because the threshold voltage adjustment ion implantation is performed after the gate dielectric layer is formed, an oxidation process for forming a gate dielectric layer is no longer needed after the threshold voltage adjustment ion implantation. Therefore, loss of impurities implanted by the threshold voltage adjustment ion implantation is reduced.

In some forms, an angle between an ion implantation direction of the threshold voltage adjustment ion implantation and a normal of an upper surface of the semiconductor fin 202 ranges from 10° to 20°, for example, 15°. Further, in some forms, the ion implantation direction of the threshold voltage adjustment ion implantation may be substantially parallel to a plane that is perpendicular to a side surface of the semiconductor fin 202. That is, the ion implantation direction of the threshold voltage adjustment ion implantation is substantially parallel to a cross section of the semiconductor fin in a direction perpendicular to the channel.

It should be understood that the surface of the semiconductor fin includes an upper surface and two side surfaces. It should be understood that the term "substantially parallel" indicates being parallel within a range of semiconductor process variations.

Implantation conditions of the threshold voltage adjustment ion implantation are different from an NMOS device and a PMOS device. In some forms, the semiconductor device may include an NMOS device. Implantation conditions of the threshold voltage adjustment ion implantation for the NMOS device include that: the implanted ions are boron ions, the implanted energy ranges from 0.5 Kev to 5 Kev, and the implanted dose ranges from $1 \times 10^{13}$/cm2 to $1 \times 10^{14}$/cm2. In another form, the semiconductor device may include a PMOS device. Implantation conditions of the threshold voltage adjustment ion implantation for the PMOS device include that: the implanted ions are arsenic ions, the implanted energy ranges from 1 Kev to 10 Kev, and the implanted dose ranges from $5 \times 10^{12}$/cm2 to $5 \times 10^{13}$/cm2.

FIG. 3 to FIG. 7 are schematic diagrams of cross sections in respective phases of forming a substrate structure. The process of forming a substrate structure is described below with reference to FIG. 3 to FIG. 7.

Figure 3:
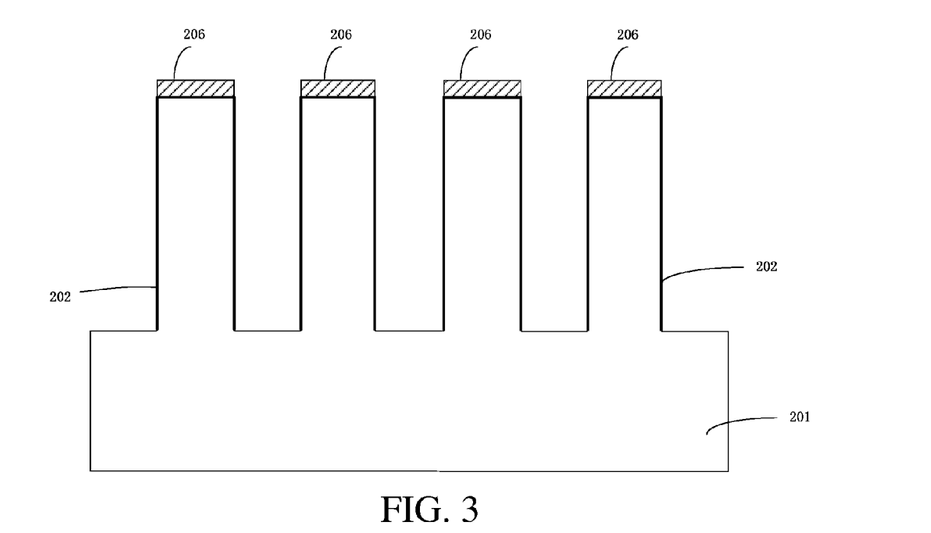
FIG. 3 is a schematic diagram of a cross section in a phase of forming a substrate structure according to a form of the present disclosure.

First, as shown in FIG. 3, a semiconductor substrate 201 is provided and a semiconductor fin 202 is formed on the semiconductor substrate 201. In this form, the semiconductor substrate 201 may be, for example, an single-element semiconductor substrate such as a silicon substrate or a germanium substrate, or may also be a compound semiconductor substrate such as a gallium arsenide substrate. However, the present disclosure is not limited thereto. In an implementing manner, the semiconductor fin 202 may be formed by using the following method: First, a patterned hard mask 206 is formed on the semiconductor substrate 201. The hard mask may be, for example, silicon nitride, silicon oxide, and silicon oxynitride. In some implementation, a buffering layer, for example, silicon oxide, is further formed between the semiconductor substrate 201 and the hard mask 206. The buffering layer facilitates adhesion of the hard mask and the semiconductor substrate. Subsequently, the semiconductor substrate 201 is etched using the patterned hard mask 206 as a mask, so as to form a semiconductor fin 202 on the semiconductor substrate 201.

Figure 4:
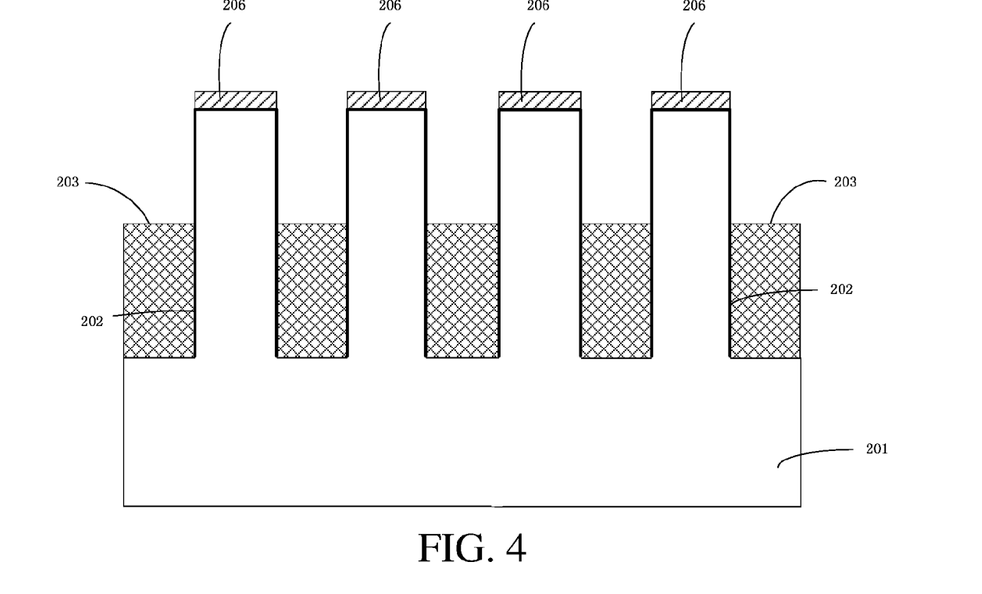
FIG. 4 is a schematic diagram of a cross section in a phase of forming a substrate structure according to a form of the present disclosure.

As shown in FIG. 4, isolation regions 203 are then formed on the semiconductor substrate 201 at two sides of the semiconductor fin 202. In an implementing manner, the isolation regions may be formed by using the following method:

First, an isolating material is deposited so as to fill spaces at two sides of the semiconductor fin and to cover the semiconductor fin. For example, the isolating material (for example, a dielectric material) may be deposited through a Flowable Chemical Vapour Deposition (FCVD) technique. In this form, in a case where a hard mask is provided on the semiconductor fin, the deposited isolating material fills the spaces at two sides of the semiconductor fin and covers the hard mask on the semiconductor fin. In some forms, before depositing an isolating material, a liner layer (for example, a thin silicon oxide layer formed through thermal oxidation) may be formed on surfaces of the semiconductor substrate and the semiconductor fin, so as to restore surface damages of the semiconductor substrate and the semiconductor fin caused during forming of the semiconductor fin by etching.

Then, the isolating material is planarized. For example, chemical mechanical polishing may be performed on the isolating material, so as to enable a top surface of the isolating material and a top surface of the semiconductor fin to be substantially level with each other. In this form, in a case where a hard mask is provided on the semiconductor fin, the hard mask on the semiconductor fin may also be removed while planarizing the isolating material, so as to enable the top surface of the isolating material and the top surface of the semiconductor fin to be substantially level with each other.

Subsequently, a part of the remaining isolating material is removed, to expose a part of the semiconductor fin, so as to form the isolation regions. In this form, in a case where a liner layer is formed on the surfaces of the semiconductor substrate and the semiconductor fin, the liner layer at two sides of the part of the remaining isolating material is also removed while removing the part of the remaining isolating material, so as to expose a part of the semiconductor fin.

Figure 5:
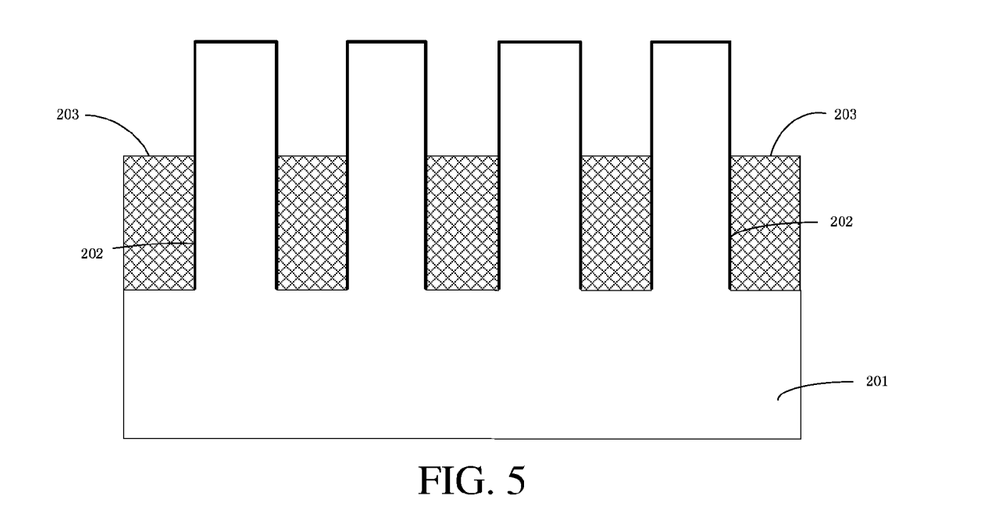
FIG. 5 is a schematic diagram of a cross section in a phase of forming a substrate structure according to a form of the present disclosure.

As described above, in a case where a hard mask 206 is provided on the semiconductor fin 202, the hard mask 206 may be removed in a process of planarizing the isolating material, or the hard mask 206 may be removed in an additional step after the isolation regions 203 are formed, so as to form the structure shown in FIG. 5.

Figure 6A:
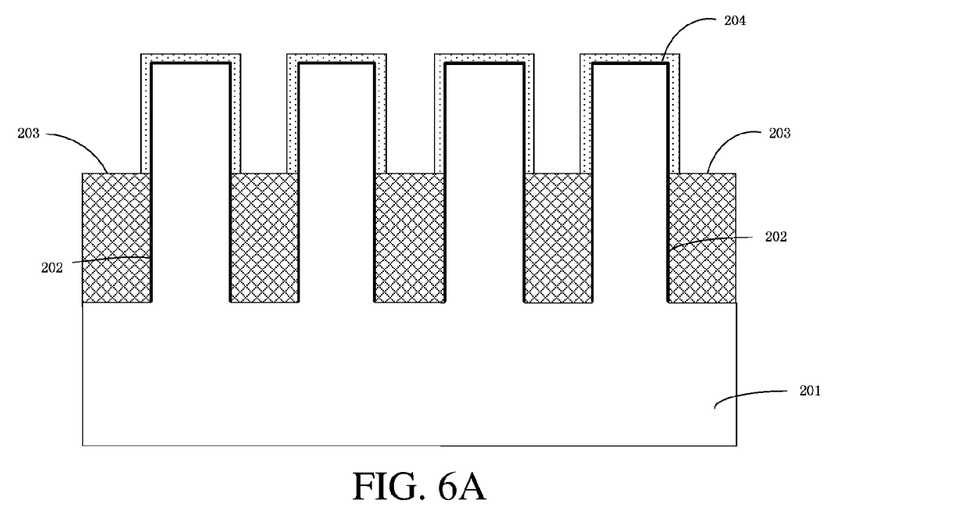
FIG. 6A is a schematic diagram of a cross section in a direction perpendicular to a channel in a phase of forming a substrate structure according to a form of the present disclosure.
Figure 6B:
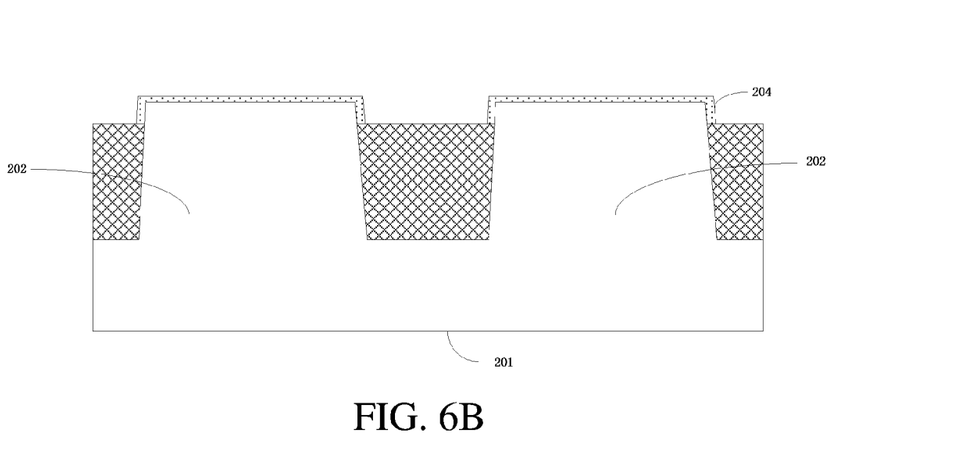
FIG. 6B is a schematic diagram of a cross section in a direction along the channel in the phase shown in FIG. 6A.

Subsequently, as shown in FIG. 6A and FIG. 6B, a gate dielectric layer 204 is formed on a surface of the semiconductor fin 202 above the isolation regions 203. In some forms, the material of the semiconductor fin may be silicon. In this case, the surface of the semiconductor fin above the isolation regions may be oxidized, to form a silicon oxide as a gate dielectric layer.

Figure 7:
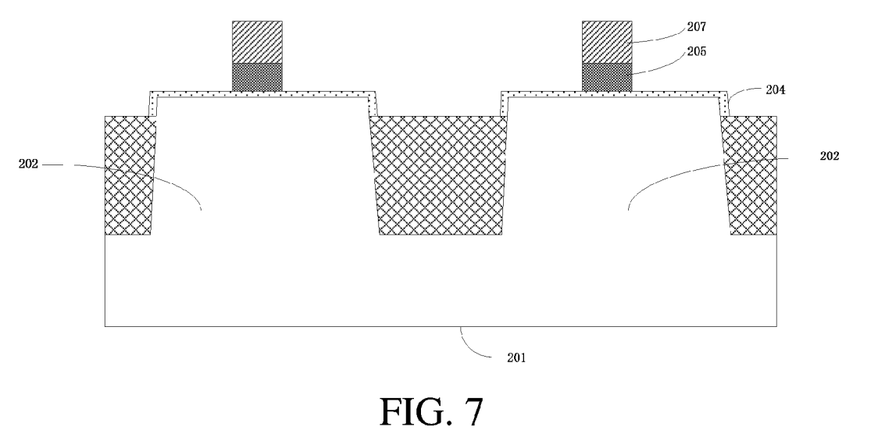
FIG. 7 is a schematic diagram of a cross section in a phase of forming a substrate structure according to a form of the present disclosure.

Then, as shown in FIG. 7, a gate 205 is formed on a part of the gate dielectric layer 204, so that the substrate structure shown in FIG. 2A is formed. In this form, the gate 205 may be, for example, a polysilicon gate. In some forms, a hard mask 207 may be provided on the gate 205. The hard mask 207 may be removed from the gate 205 after s source region and a drain region are subsequently formed.

Figure 8:
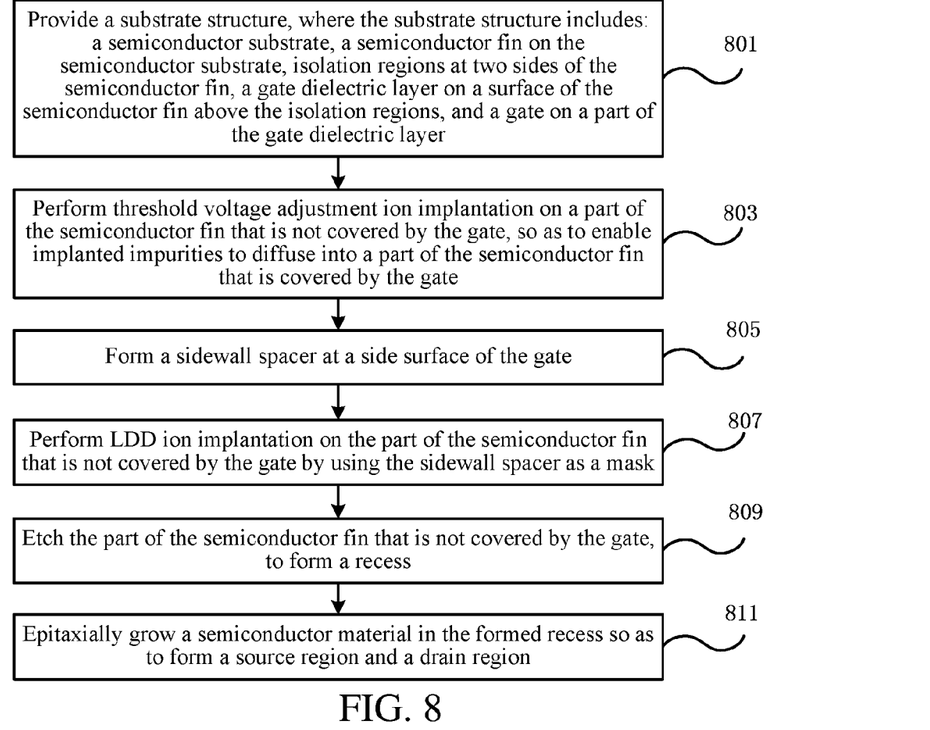
FIG. 8 is a flow chart of a manufacturing method for a semiconductor device according to another form of the present disclosure.
Figure 9:
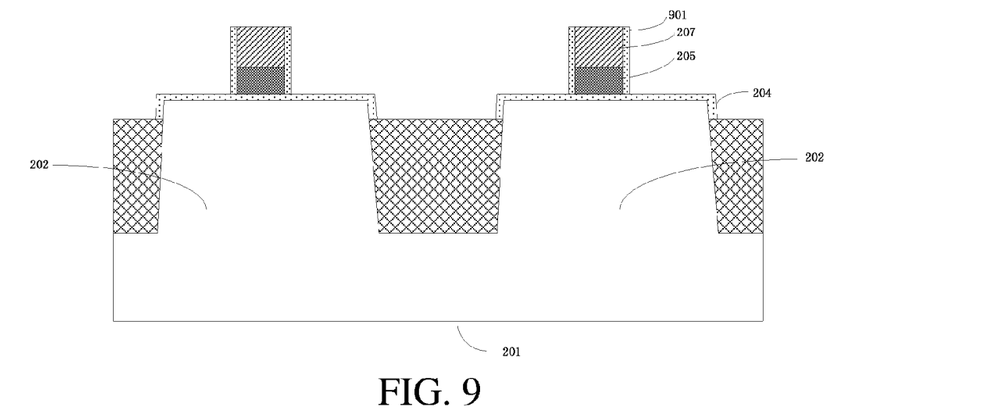
FIG. 9 is a schematic diagram of a cross section in a phase of a manufacturing method for a semiconductor device according to another form of the present disclosure.

FIG. 8 is a flow chart of a manufacturing method for a semiconductor device according to another form of the present disclosure. Specific implementations of step 801 and step 803 may be referred to in previous descriptions of step 101 and step 103, which are not described again herein. The manufacturing method for a semiconductor device shown in FIG. 8 further includes:

Step 805: Form a sidewall spacer 901 at a side surface of the gate 205, as shown in FIG. 9. The sidewall spacer 901 may be an offset spacer, for example, an oxide layer. In this form, in a case where a hard mask 207 is provided on the gate 205, the sidewall spacer 901 is also further on a side surface of the hard mask 207.

Figure 10:
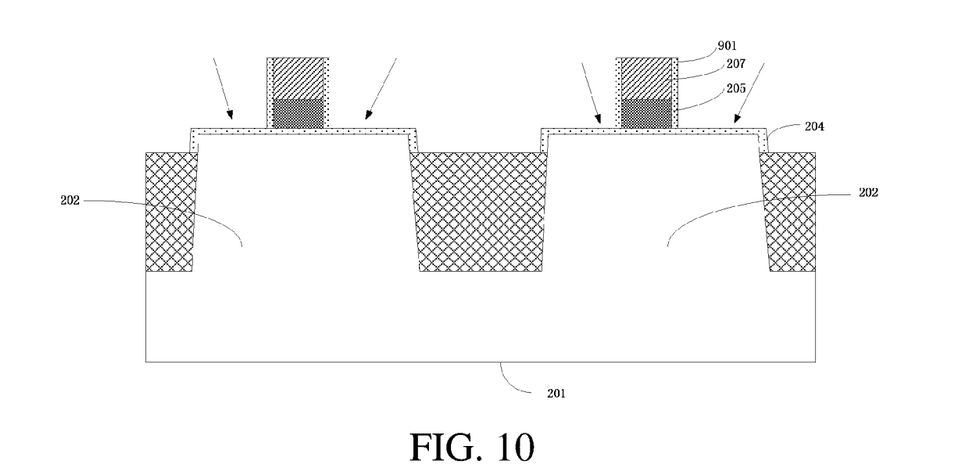
FIG. 10 is a schematic diagram of a cross section in a phase of a manufacturing method for a semiconductor device according to another form of the present disclosure.

Step 807: Perform light doped drain (LDD) ion implantation on the part of the semiconductor fin that is not covered by the gate by using the sidewall spacer 901 as a mask, as shown in FIG. 10. In some forms, the implanted dose of the threshold voltage adjustment ion implantation is less than the implanted dose of the LDD ion implantation, so that impurities implanted by the threshold voltage adjustment ion implantation do not influence resistance of an LDD region. For instance, the implanted dose of the LDD ion implantation may range from 5×1014/cm2 to 1×1015/cm2. For an NMOS device, the ions of the LDD ion implantation may be arsenic ions. For a PMOS device, the ions of the LDD ion implantation may be BF2+.

Step 809: Etch the part of the semiconductor fin that is not covered by the gate, to form a recess.

Figure 11:
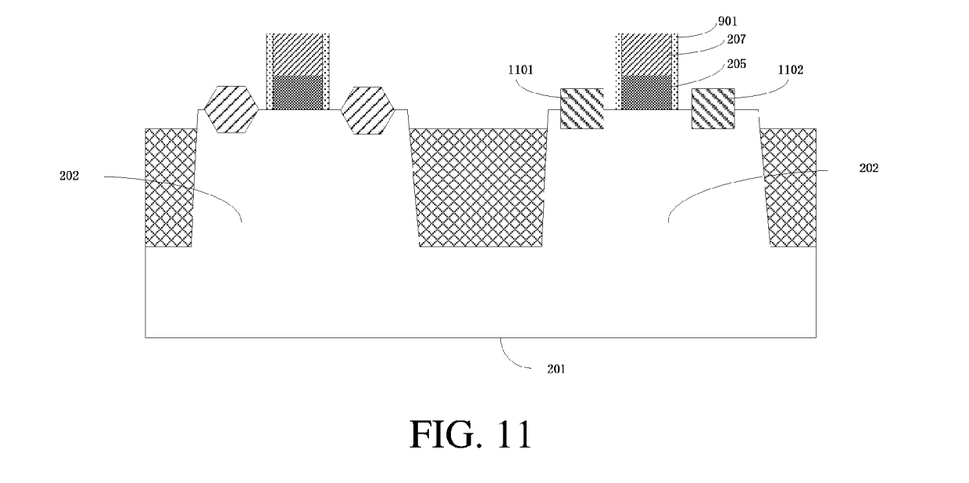
FIG. 11 is a schematic diagram of a cross section in a phase of a manufacturing method for a semiconductor device according to another form of the present disclosure.

Step 811: Epitaxially grow a semiconductor material in the formed recess so as to form a source region 1101 and a drain region 1102, as shown in FIG. 11. The epitaxially grown semiconductor material may introduce tension to a channel region, so as to increase mobility of carriers. In some forms, for an NMOS device, the epitaxially grown semiconductor material may include: SiC or Si. For a PMOS device, the epitaxially grown semiconductor material may include SiGe.

It should be pointed out that, in some other forms, the manufacturing method for a semiconductor device may also include step 801 to step 805 shown in FIG. 8 only, or, may include step 801 to step 807 shown in FIG. 8.

The present disclosure also provides a semiconductor device. Referring to FIG. 2B, the semiconductor device includes: a semiconductor substrate 201; a semiconductor fin 202 on the semiconductor substrate; isolation regions 203 at two sides of the semiconductor fin; a gate dielectric layer 204 on a surface of the semiconductor fin above the isolation regions; and a gate 205 on a part of the gate dielectric layer 204.

The semiconductor device also includes a first impurities region and a second impurities region (not shown). The first impurities region is located in the part of the semiconductor fin that is not covered by the gate. The second impurities region is located in the part of the semiconductor fin that is covered by the gate. The first impurities region is formed through threshold voltage adjustment ion implantation on the part of the semiconductor fin that is not covered by the gate after the gate is formed. The second impurities region is formed after the impurities implanted by the threshold voltage adjustment ion implantation diffuse into the part of the semiconductor fin that is covered by the gate.

In some forms, the gate dielectric layer 204 includes impurities implanted by the threshold voltage adjustment ion implantation.

In some forms, referring to FIG. 11, the semiconductor device may further include: a source region 1101 and a drain region 1102 located in the part of the semiconductor fin that is not covered by the gate.

So far, the semiconductor device and the manufacturing method therefor according to forms of the present disclosure have been described in detail. To avoid shielding of the concept of the present disclosure, some well-known details in this field are not described. A person skilled in the art would fully understand how to implement the technical solution disclosed herein according to the above description. In addition, the respective forms taught by the disclosure of the present disclosure can be freely combined. A person skilled in the art should understand that various amendments can be made to the above described forms without departing from the scope and the spirit of the present disclosure.

What is claimed is:

1. A manufacturing method for a semiconductor device, comprising:
   providing a substrate structure, wherein the substrate structure comprises:
   a semiconductor substrate,
   a semiconductor fin on the semiconductor substrate,
   isolation regions at two sides of the semiconductor fin, and a gate dielectric layer on a surface of the semiconductor fin above the isolation regions, and
   a gate on a part of the gate dielectric layer;
   performing threshold voltage adjustment ion implantation on a part of the semiconductor fin that is not covered by the gate, so as to enable implanted impurities to diffuse into a part of the semiconductor fin that is covered by the gate for adjusting a channel threshold of gate voltage; and
   performing light doped drain (LDD) ion implantation separate from the threshold voltage adjustment ion implantation on the part of the semiconductor fin that is not covered by the gate.

2. The method according to claim 1, wherein an included angle between an ion implantation direction of the threshold voltage adjustment ion implantation and a normal of an upper surface of the semiconductor fin ranges from 10° to 20°.

3. The method according to claim 2, wherein the ion implantation direction of the threshold voltage adjustment ion implantation is substantially parallel to a plane that is perpendicular to a side surface of the semiconductor fin.

4. The method according to claim 1, wherein implantation conditions of the threshold voltage adjustment ion implantation comprise: boron ions as implanted ions, an implantation energy ranges from 0.5 Kev to 5 Kev, and an implantation dose ranges from $1\times10^{13}/cm^2$ to $1\times10^{14}/cm^2$.

5. The method according to claim 1, wherein implantation conditions of the threshold voltage adjustment ion implantation comprise: arsenic ions as implanted ions, an implantation energy ranges from 1 Kev to 10 Kev, and an implantation dose ranges from $5\times10^{12}/cm^2$ to $5\times10^{13}/cm^2$.

6. The method according to claim 1, further comprising:
   forming a sidewall spacer on a side surface of the gate prior to performing the LDD ion implantation.

7. The method according to claim 6, wherein the sidewall spacer is used as a mask for the LDD ion implantation.

8. The method according to claim 7, wherein an implantation dose of the threshold voltage adjustment ion implantation is less than an implantation dose of the LDD ion implantation.

9. The method according to claim 7, wherein an implantation dose of the LDD ion implantation ranges from $5 \times 10^{14}/cm^2$ to $1 \times 10^{15}/cm^2$.

10. The method according to claim 6, further comprising:
    etching the part of the semiconductor fin that is not covered by the gate, to form a recess; and
    epitaxially growing a semiconductor material in the formed recess so as to form a source region and a drain region.

11. The method according to claim 10, wherein a hard mask is provided on the gate; and
    wherein the method further comprises: after the source region and the drain region are formed, removing the hard mask from the gate.

12. The method according to claim 10, wherein the semiconductor material comprises: SiGe, SiC, or Si.

13. The method according to claim 1, wherein the step of providing a substrate structure comprises:
    providing a semiconductor substrate;
    forming a semiconductor fin on the semiconductor substrate;
    forming isolation regions on the semiconductor substrate at two sides of the semiconductor fin;
    forming a gate dielectric layer on a surface of the semiconductor fin above the isolation regions; and
    forming a gate on a part of the gate dielectric layer.

14. The method according to claim 13, wherein the step of forming a semiconductor fin on the semiconductor substrate comprises:
    forming a patterned hard mask on the semiconductor substrate; and
    etching the semiconductor substrate by using the patterned hard mask as a mask, so as to form a semiconductor substrate and a semiconductor fin on the semiconductor substrate; and
    wherein the method further comprises:
    after the isolation regions are formed on the semiconductor substrate at two sides of the semiconductor fin, removing the patterned hard mask from the semiconductor fin.

15. The method according to claim 13, wherein the step of forming isolation regions on the semiconductor substrate at two sides of the semiconductor fin comprises:
    depositing an isolating material so as to fill spaces at two sides of the semiconductor fin and to cover the semiconductor fin;
    planarizing the isolating material; and
    removing a part of remaining isolating material, to expose a part of the semiconductor fin, so as to form the isolation regions.

16. The method according to claim 15, further comprising:
    before depositing an isolating material, forming a liner layer on surfaces of the semiconductor substrate and the semiconductor fin; and
    during removal of the part of the remaining isolating material, also removing the liner layer at two sides of the part of the remaining isolating material, so as expose a part of the semiconductor fin.

17. The method according to claim 13, wherein material of the semiconductor fin is silicon; and
    wherein forming a gate dielectric layer on a surface of the semiconductor fin above the isolation regions comprises:
    oxidizing a surface of the semiconductor fin above the isolation regions, to form a silicon oxide as the gate dielectric layer.

* * * * *